(12) United States Patent
Setiadi et al.

(10) Patent No.: US 7,936,057 B2
(45) Date of Patent: May 3, 2011

(54) HIGH BANDWIDTH PACKAGE

(75) Inventors: Dadi Setiadi, Edina, MN (US); Patrick Ryan, St. Paul, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 268 days.

(21) Appl. No.: 12/264,522

(22) Filed: Nov. 4, 2008

(65) Prior Publication Data

US 2010/0109153 A1 May 6, 2010

(51) Int. Cl.
*H01L 23/02* (2006.01)
(52) U.S. Cl. ........ 257/686; 257/685; 257/713; 257/722; 257/E25.005; 257/E25.006; 257/E25.01; 257/E25.013; 257/E25.02; 257/E25.021; 257/E25.023; 257/E25.027; 257/E23.085
(58) Field of Classification Search .................. 257/685, 257/686, 706, 722, 723, 777, 796, E25.006, 257/E25.013, E23.017, E23.018, E23.021, 257/E25.027, E23.085, 713, E25.005, E25.01, 257/E25.011, E25.015, E25.016, E25.02, E25.023, E25.026; 438/109, FOR. 368
See application file for complete search history.

(56) References Cited

U.S. PATENT DOCUMENTS

| | | | | |
|---|---|---|---|---|
| 6,239,487 | B1 * | 5/2001 | Park et al. | 257/712 |
| 6,417,027 | B1 * | 7/2002 | Akram | 438/109 |
| 6,514,792 | B2 * | 2/2003 | Katchmar | 438/107 |
| 6,977,433 | B2 | 12/2005 | Rugg | |
| 2010/0022035 | A1 * | 1/2010 | Yamano | 438/15 |

* cited by examiner

*Primary Examiner* — Jasmine J Clark
(74) *Attorney, Agent, or Firm* — Fellers, Snider, et al.

(57) ABSTRACT

Method and apparatus for constructing and operating a high bandwidth package in an electronic device, such as a data storage device. In some embodiments, a high bandwidth package comprises a first known good die that has channel functions, a second known good die that has a controller function, and a third known good die that has a buffer function. Further in some embodiments, the high bandwidth package has pins that connect to each of the first, second, and third dies.

20 Claims, 5 Drawing Sheets

HIGH BANDWIDTH PACKAGE

BACKGROUND

Electronic devices generally operate to store and retrieve data in a fast and efficient manner. Some storage devices utilize numerous chips on a circuit board to facilitate the various functions of the device. The chips occasionally are stacked vertically and packaged to save space on a circuit board.

As will be appreciated, individual chips in a package often are plagued by errors that are inherent with manufacturing variance that cannot be corrected once packaged. The reliability of the circuit board is hindered when multiple functions are connected in a single package. Thus, errors can affect the functionality of packaged chips so that considerable loss in efficiency and accuracy is noticeable.

In these and other types of electronic devices, it is often desirable to increase simplicity and accuracy, particularly with regard to reliability of components of a chip package once packaged.

SUMMARY

Various embodiments of the present invention are generally directed to a method and apparatus for constructing and operating a high bandwidth package in an electronic device such as, but not limited to, a data storage device.

In accordance with various embodiments, a first known good die that has channel functions is utilized in the high bandwidth package. Further, a second known good die that has a controller function and a third known good die that has a buffer function are incorporated into a single package with the first known good die. The first, second, and third known good dies are each connected with pins of the high bandwidth package.

In other embodiments, a first, second, and third known good dies are enclosed to form a high bandwidth package. Where the first known good die has channel functions, the second known good dies has controller functions, and the third known good die has buffer functions.

These and various other features and advantages which characterize the various embodiments of the present invention can be understood in view of the following detailed discussion and the accompanying drawings.

DETAILED DESCRIPTION

Figure 1:
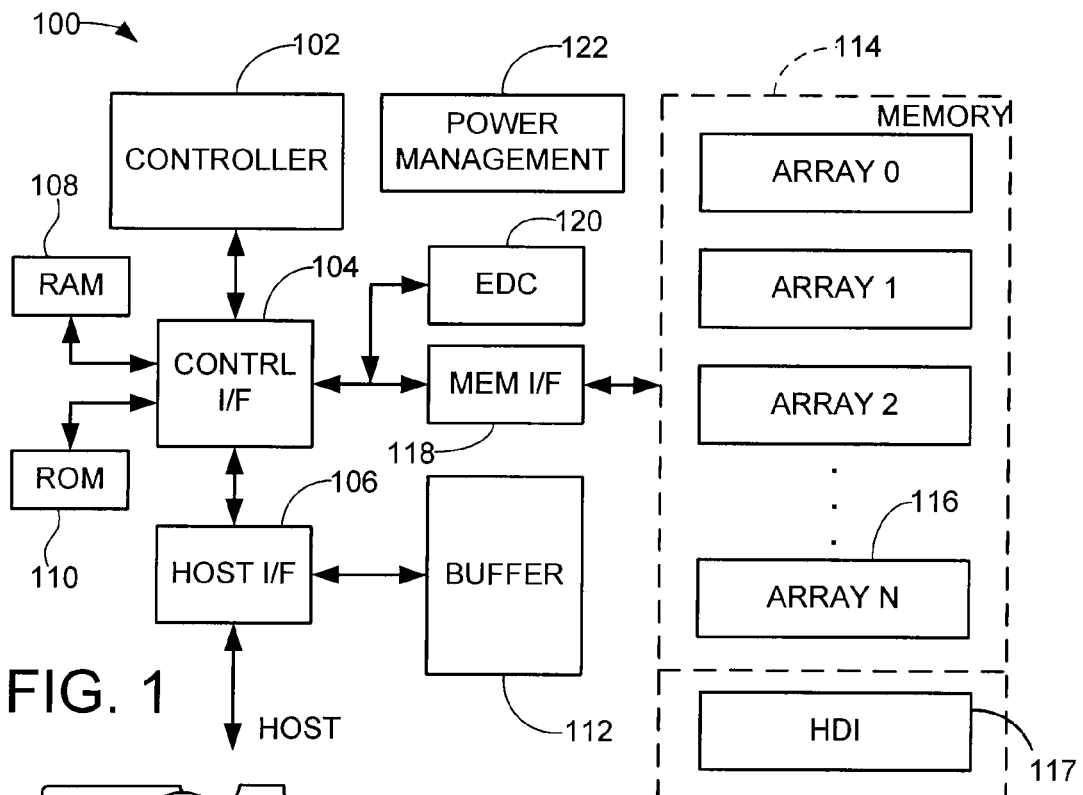
FIG. 1 is a generalized functional representation of an exemplary electronic device constructed and operated in accordance with various embodiments of the present invention.

FIG. 1 provides a functional block representation of an electrical device 100, such as a data storage device constructed and operated in accordance with various embodiments of the present invention. The electrical device is contemplated as comprising a non-volatile memory storage device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device.

A memory space is shown at 114 to comprise a number of memory arrays 116 (denoted Array 0-N), although it will be appreciated that a single array can be utilized as desired. Each array 116 comprises a block of semiconductor memory of selected storage capacity. Further in the memory space 114, a hard disk interface 117 can be included to allow a magnetic data storage device to be implemented. The hard disk interface 117 can be accessed by the memory interface 118 either individually or in combination with other data storage memory arrays 116.

Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in some embodiments the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
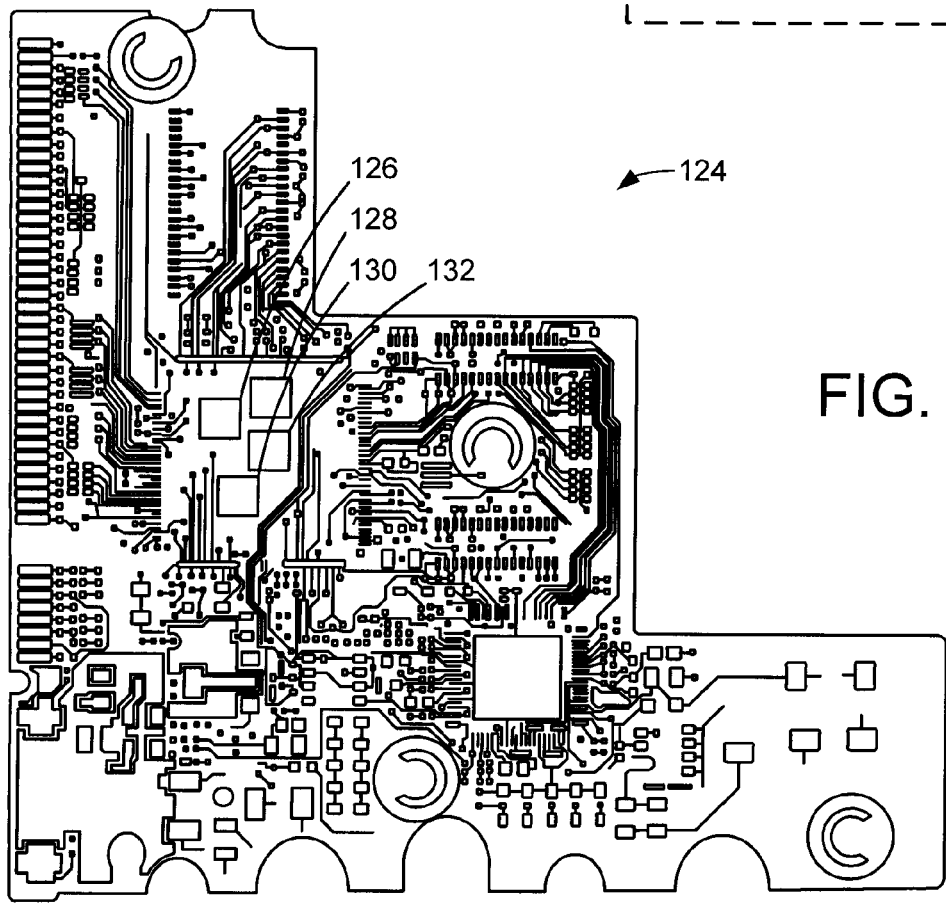
FIG. 2 generally illustrates a conventional printed circuit board.

FIG. 2 provides an exemplary printed circuit board 124. A printed circuit board 124 is often utilized in various electronic devices 100 including, but not limited to, data storage devices. The functions of an electronic device 100 are controlled by the hardware installed on, and connected by, the printed circuit board 124. Hardware on a printed circuit board 124 can include an application specific integrated circuit (ASIC) controller 126, a memory buffer 128, a servo motor control logic 130, and a read channel signal processor 132. It should be noted that the printed circuit board 124 can employ numerous individual chips with independent functions, individual chips with multiple functions, or a single package having multiple functions either alone or in combination with one another. For example the memory buffer 128 can consist of two dies: a non-volatile memory such as, but not limited to NOR flash, and a volatile memory such as, but not limited to dynamic RAM (DRAM).

Figure 3:
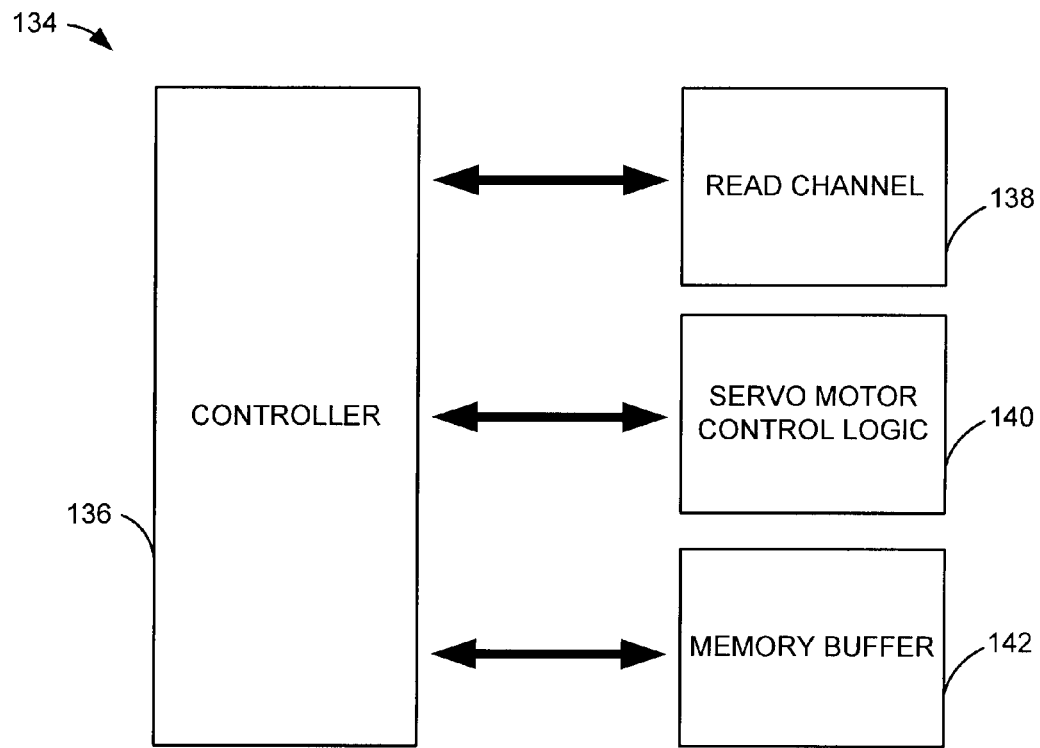
FIG. 3 is a generalized block diagram of a controller.

A block diagram of a general electronic device control structure 134 is displayed in FIG. 3. The electronic control structure 134 has a main controller 136 that sends and receives signals to various components of the electrical device 100. In some embodiments, the controller 136 is an ASIC controller that manages a read channel processor 138, a servo motor control logic 140, and a memory buffer 142. While the servo motor control logic 140 is utilized for electronic devices 100 with rotating data storage mechanisms, the control logic is not required for electronic devices 100 that store data in solid state memory.

Figure 4:
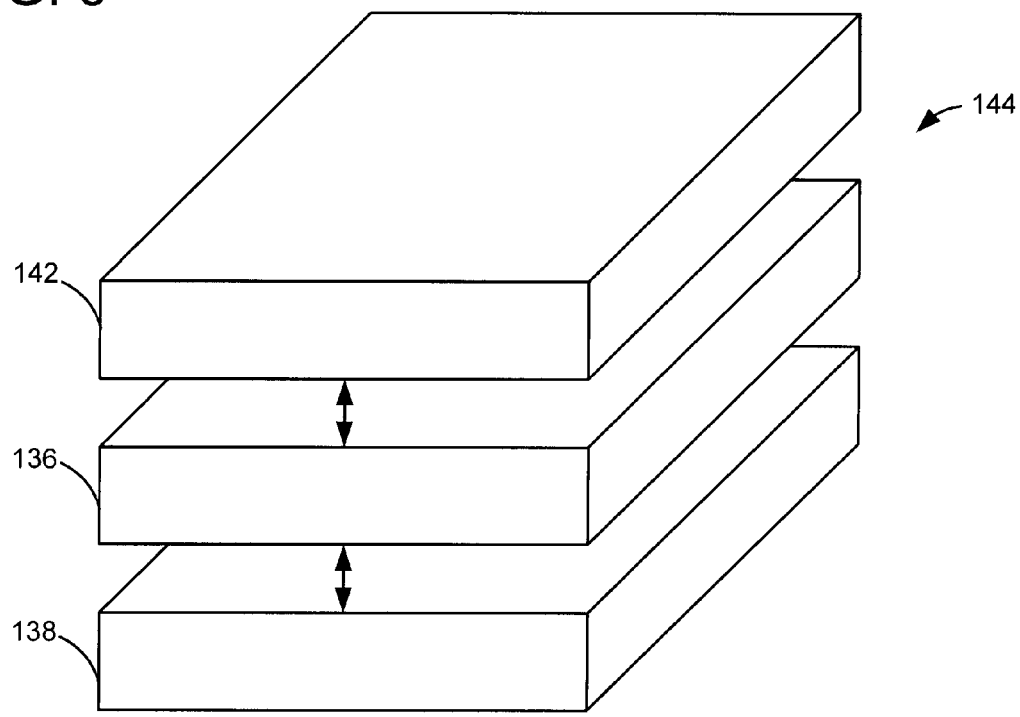
FIG. 4 displays a block diagram of a package constructed and operated in accordance with the various embodiments of the present invention.

FIG. 4 shows a block diagram of a high bandwidth package 144 constructed and operated in accordance with the various embodiments of the present invention. The high bandwidth package 144 has a memory buffer 142 attached to a controller 136 that is attached to a read channel processor 138. The position of the controller 136 between the memory buffer 142 and the read channel processor 138 allows for optimal efficiency of the package 144 due to shortened interconnect pathways from the controller 136 to the respective components. In some embodiments, the controller 136 is an ASIC controller that controls a servo motor control logic either on the same chip or as a layer adjacent to either the memory buffer 142 or read channel processor 138.

Figure 5:
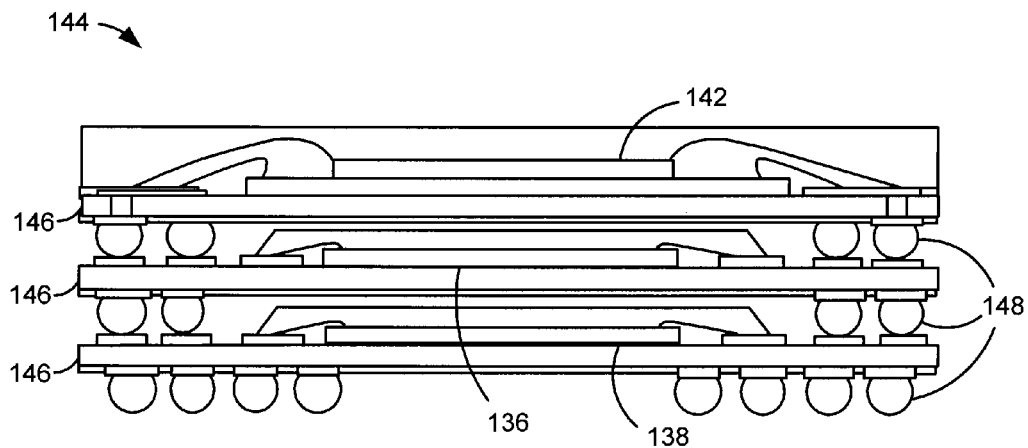
FIG. 5 shows a cross-sectional view of a package constructed and operated in accordance with the various embodiments of the present invention.

In FIG. 5, a cross-section of a high bandwidth package 144 is generally illustrated. The high bandwidth package 144 employs a package on package structure that allows vertical stacking of individual chips to create an integrated circuit. The circuitry of the chip that functions to operate the electronic device, such as the controller 136, read channel processor 138, or memory buffer 142 of FIG. 4 are each integrated onto a die 146 that are connected with interconnects 148. In some embodiments, each die 146 is a known good die (KGD) that has been environmentally tested at wafer level before being manufactured into a chip. The wafer level testing of a KGD includes laser repair of bad cells, followed by retesting as necessary. The use of KGD for each chip greatly increases the performance and reliability of the high bandwidth package 144 due to the thorough testing and repair of each die before implementation into the package.

Further in the high bandwidth package 144, each KGD has circuitry for a single function such as controller 138 or memory buffer 142. The packaging of the dies 146 into a single high bandwidth package 144 greatly reduces the number of interconnects 148 that must be used to properly transmit signals and power between the dies 146. The reduced number of interconnects 148 also decreases the noise and radiated emissions of the package 144. It should be noted that another KGD can be stacked onto the die 146 housing the read channel processor 138 circuitry that functions as a servo motor control logic 140. The structure and benefits of the package 144 will not be hindered by the addition of a fourth die.

Figure 6:
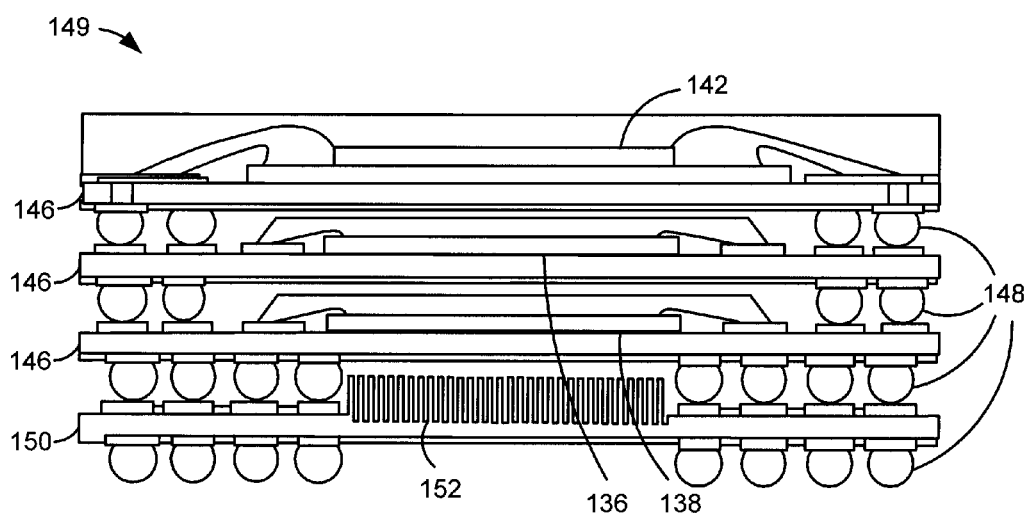
FIG. 6 displays a cross-sectional view of an alternative package structure capable of being constructed and operated in accordance with the various embodiments of the present invention.

An alternative structure for a high bandwidth package 149 is displayed in FIG. 6. A heat sink 150 has been connected to the die 146 containing the read channel 138 circuitry. The controller 136 and memory buffer 142 are attached adjacently vertical from the channel 138. The heat sink 150 has a number of fins 152 that provide added surface area to dissipate heat. In other embodiments, the heat sink 150 is placed above the die 146 containing the read channel 138 circuitry. Further, numerous heat sinks 150 can be placed in the package to more efficiently dissipate heat that could damage or decrease performance of the high bandwidth package 149.

It can be appreciated that heat can be alternatively dissipated by placing a thermal interface material on the printed circuit board adjacent to the package. In addition, the position of the known good dies 146 can be configured so that the die emitting the most heat during operation is placed on the bottom of the package so that two die 146 are vertically above the selected die. Alternatively, the position of the known good die 146 that emits the most heat during operation can be packaged at the top of the package so that two die 146 are vertically below the selected die.

Figure 7:
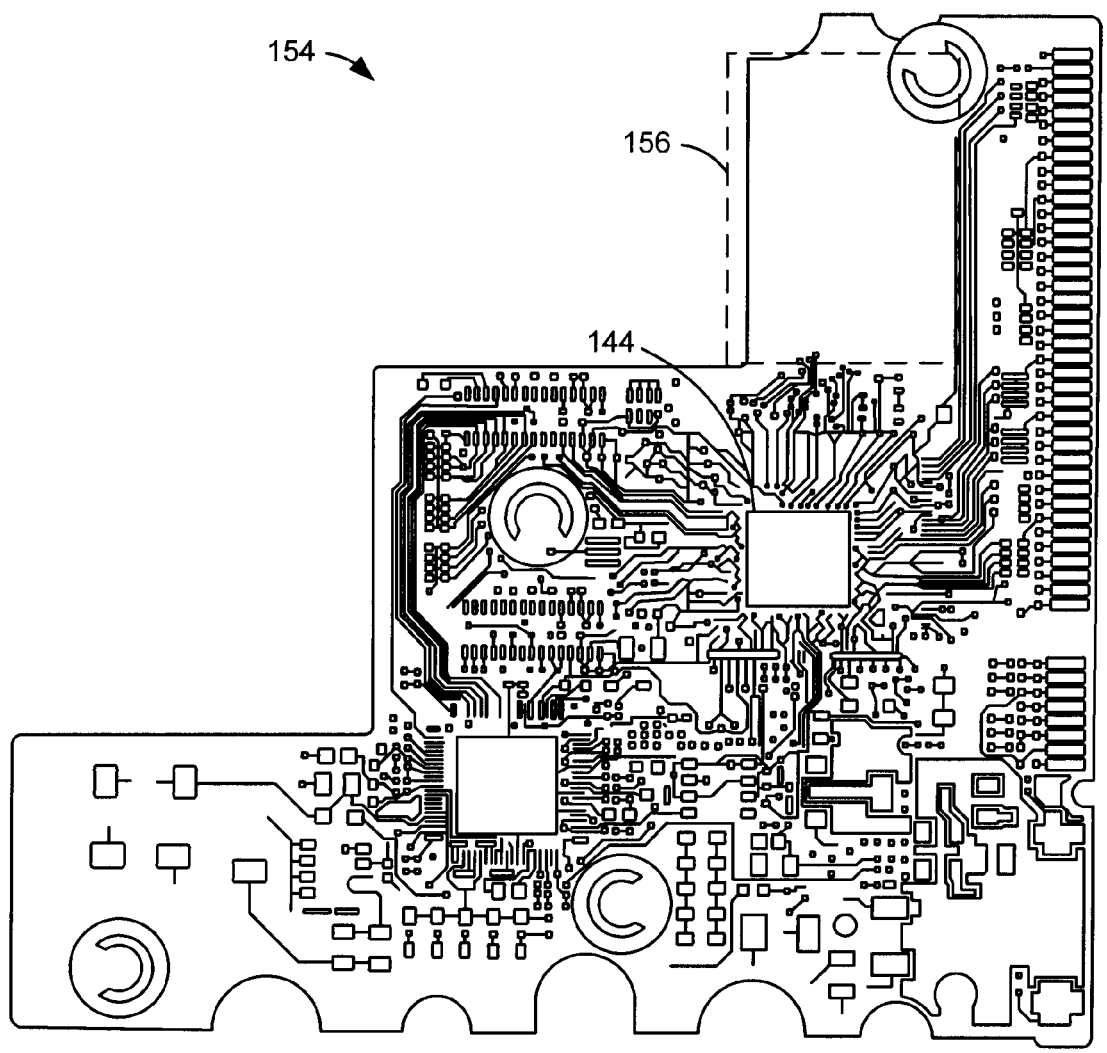
FIG. 7 generally illustrates a printed circuit board utilizing a high bandwidth package constructed in accordance with the various embodiments of the present invention.

FIG. 7 generally illustrates a printed circuit board 154 employing a high bandwidth package 144. The increased bandwidth of vertically stacked chips eliminates numerous connections between the various die placed on the circuit board 154 as shown in FIG. 2. The blank area 156 surrounds the primary area of circuit board interconnect savings that leads to greater electrical device 100 performance due in part to reduced noise.

Figure 8:
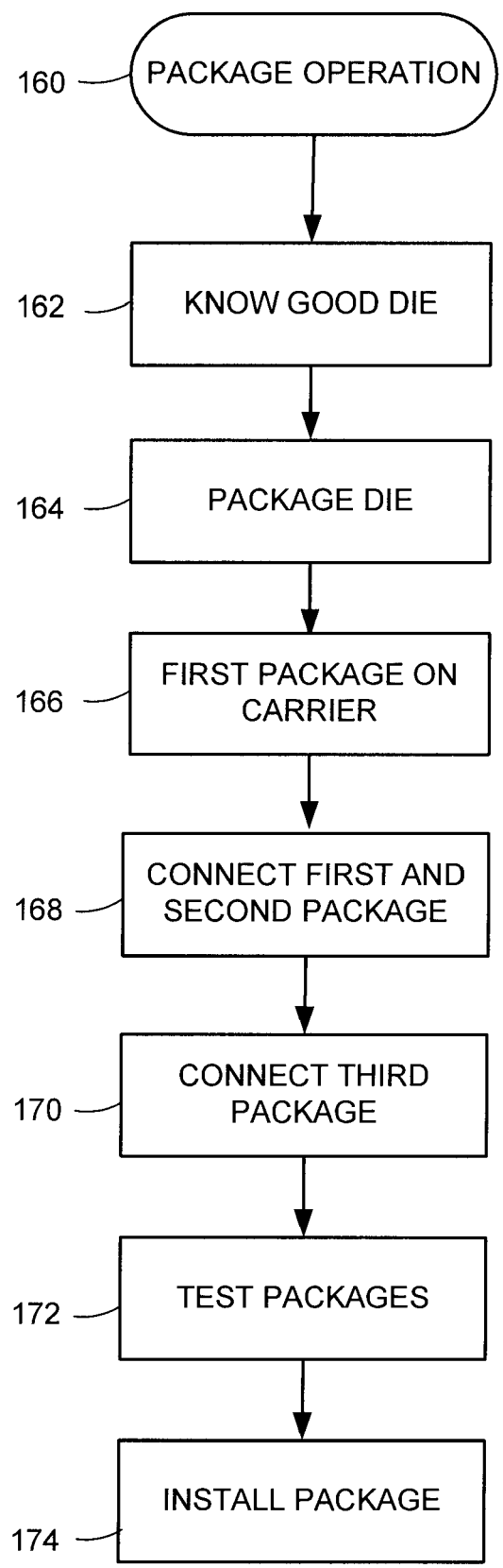
FIG. 8 shows a flow diagram of a package operation carried out in accordance with the various embodiments of the present invention.

FIG. 8 displays a flow diagram of a package operation 160 performed in accordance with the various embodiments of the present invention. The package operation 156 initially tests each die 146 for compliance as a known good die at step 162. Step 164 packages the function circuitry, such as controller 136, with the known good die 146. The first package is placed on a carrier that allows for interconnection with other packages in step 166. The first package is connected with a second package containing a function circuitry in step 168 and subsequently step 170 connects a third package comprising function circuitry and a known good die to the first and second packages. The first, second, and third packages are tested at step 172 and enclosed into a single package if the test is passed. Finally, the package 144 is installed into an electrical device 100, such as into a printed circuit board of FIG. 7.

As can be appreciated by one skilled in the art, the various embodiments illustrated herein provide advantages in both electronic device efficiency and complexity. The use of tested and repaired known good die in conjunction with single function chips in a package increases the performance of the electrical device while reducing the noise associated with conventional chip integration. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising a first known good die having channel functions, a second known good die having controller functions, a third known good die having a buffer function, and a fourth known good die having servo motor control logic function, wherein the first, second, third, and fourth dies are packaged together in a single integrated circuit (IC) by connecting the first, second, third, and fourth dies with at least one interconnect.

2. The apparatus of claim 1, further comprising a heat sink being packaged with the first, second, third, and fourth dies in the single (IC).

3. The apparatus of claim 2, wherein a plurality of heat sinks are enclosed in the (IC), the plurality of heat sinks including heat sink fins.

4. The apparatus of claim 2, wherein the first, second, third, and fourth dies are arranged so that the die that emits the most heat during operation is packaged closest to the heat sink.

5. The apparatus of claim 1, wherein the (IC) is installed on a printed circuit board.

6. The apparatus of claim 5, wherein the printed circuit board has a thermal interface material that is configured to draw heat away from the adjacently installed (IC).

7. The apparatus of claim 1, wherein the at least one interconnect is a pin.

8. The apparatus of claim 1, wherein the known good dies have standardized interfaces.

9. The apparatus of claim 1, wherein at least one known good die comprises a previously defective die that has been repaired prior to packaging in the single (IC).

10. A method comprising:
  connecting a first known good die having channel functions to a second known good die having controller functions with interconnects;
  connecting a third known good die having buffer functions and a fourth known good die having servo motor control logic function to the first and second known good dies with interconnects; and
  integrating the first, second, third, and fourth known good dies into a single (IC).

11. The method of claim 10, further comprising the step of packaging a heat sink with the first, second, third, and fourth dies in the single (IC).

12. The method of claim 11, wherein a plurality of heat sinks are enclosed in the (IC), the plurality of heat sinks including heat sink fins.

13. The method of claim 11, wherein the first, second, third, and fourth dies are arranged so that the die that emits the most heat during operation is packaged closest to the heat sink.

14. The method of claim 10, further comprising the step of installing the single (IC) on a printed circuit board.

15. The method of claim 14, wherein the printed circuit board has a thermal interface material that is configured to draw heat away from the adjacently installed (IC).

16. The method of claim 10, wherein the interconnects are pins.

17. The method of claim 10, further comprising the steps of testing each die prior to the connecting steps and testing the single (IC) after the integrating step.

18. The method of claim 17, further comprising the step of repairing a defective die.

19. An apparatus comprising:
  a first package with a first known good die having channel functions;
  a second package with a second known good die having controller functions;
  a third package with a third known good die having buffer functions; and
  a fourth package with a fourth known good die having servo motor control logic functions, the first and second packages connected with a first interconnect, the second and third packages connected with a second interconnect, and the third and fourth packages connected with a third interconnect.

20. The apparatus of claim 19, wherein the first interconnect is disposed between the first and second packages, the second interconnect is disposed between the second and third packages, the third interconnect is disposed between the third and fourth packages, and the packages are vertically stacked with the second interconnect disposed between the first and third interconnects.

* * * * *